US006272655B1

(12) United States Patent
Hecht et al.

(10) Patent No.: US 6,272,655 B1
(45) Date of Patent: Aug. 7, 2001

(54) METHOD OF REDUCING TEST TIME FOR NVM CELL-BASED FPGA

(75) Inventors: Volker Hecht; Timothy Saxe, both of Los Altos, CA (US)

(73) Assignee: Actel Corporation, Sunnyvale, CA (US)

( * ) Notice: Subject to any disclaimer, the term of this patent is extended or adjusted under 35 U.S.C. 154(b) by 0 days.

(21) Appl. No.: 09/096,142

(22) Filed: Jun. 11, 1998

(51) Int. Cl.[7] .............................. G01R 31/28; G06F 7/38
(52) U.S. Cl. ...................... 714/725; 324/765; 324/769; 326/38; 326/41; 326/44
(58) Field of Search ................................. 714/718, 721, 714/725; 365/201; 326/39, 40, 38, 41, 44; 324/765, 769

(56) References Cited

U.S. PATENT DOCUMENTS

| 5,498,978 | * | 3/1996 | Takahashi et al. ............... 326/38 |
| 5,526,312 | * | 6/1996 | Eltoukhy ......................... 365/201 |
| 5,594,363 | * | 1/1997 | Freeman et al. ................. 326/39 |
| 5,633,518 | * | 5/1997 | Bronze ....................... 365/185.1 X |
| 5,744,980 | * | 4/1998 | McGowan et al. ............... 326/40 |
| 5,867,507 | * | 2/1999 | Beebe et al. .................... 714/726 |
| 5,920,201 | * | 7/1999 | McHrotra et al. ............... 324/765 |
| 6,009,259 | * | 12/1999 | Ikeda et al. .................. 395/500.44 |

* cited by examiner

Primary Examiner—Emmanuel L. Moise
(74) Attorney, Agent, or Firm—Jonathan H. Schafer

(57) ABSTRACT

The present invention provides for a method of testing an FPGA using NVM memory cells for programmable interconnects. The NVM memory cells are arranged as a memory array of rows and columns. User-configurable logic elements and interconnections, which are programmed by the stored states of the memory cells, are organized into identical and/or differing tiles. The tiles are organized into an array of rows and columns superimposed upon the memory array. The testing method includes: selecting test circuit configurations by which identical tiles are identically programmed as much as possible; and simultaneously programming and simultaneously erasing pluralities of the memory rows corresponding to the tiles into the test circuit configurations. Additionally, the test circuit configurations programmed into the FPGA are tested at a lower supply voltage than that of normal operation. Programming is performed at reduced programming and erasing pulse voltages and times by substantially ignoring retention and disturb effect margin amounts for the NVM memory cells. In this manner, the time for testing the FPGA is considerably reduced.

11 Claims, 4 Drawing Sheets

US 6,272,655 B1

METHOD OF REDUCING TEST TIME FOR NVM CELL-BASED FPGA

BACKGROUND OF THE INVENTION

The present invention is related to the field of the testing of integrated circuits and, more particularly, to the testing of NVM-based FPGAs (non-volatile memory-based field programmable gate arrays). The present invention is particularly suitable to flash memory-based FPGAs.

Typically, an FPGA is an array of logic elements and wiring interconnections with many thousands, or even hundreds of thousands, of programmable switches so that the FPGA can be configured by the user into an integrated circuit with defined functions. Each programmable switch, or interconnect, can connect two circuit nodes in the integrated circuit to make (or break) a wiring interconnection, or to set the function or functions of a logic element.

In a reprogrammable FPGA, each programmable switch is formed by a reprogrammable memory cell which is interconnected with a switching transistor which has its source and drain connected to the two circuit nodes. These circuit nodes are part of the integrated circuit which can be configured by a user of the FPGA. The configurable circuit has an array of logic elements and interconnections which are set by the state of a memory cell and hence its interconnected switching transistor. An example of such a reprogrammable switch is described in U.S. Pat. No. 5,633,518, entitled "Nonvolatile Reprogrammable Interconnect Cell With FN Tunneling and Programming Method Thereof," and which issued May 27, 1997 to the present assignee.

A flash memory is a type of NVM (non-volatile memory). In a flash memory-based FPGA, the memory cell of each programmable switch is part of a homogeneous two-dimensional memory array by which electric charge on floating gates in the memory cells is programmed or erased. The floating gate of a memory cell is also shared with the corresponding switching transistor so that the transistor is turned on or off. Hence each switching transistor is connected by its source and drain is programmed to make (or break) a wiring interconnection, or to set the function or functions of a logic element.

The flash memory array is typically programmed by one initial erase step which erases all the memory cells of the array at once and then followed by a sequence of programming steps, which apply a data word to all columns in parallel and a selected row at a time. The whole array is usually programmed by one programming step per row.

As for all integrated circuits, the FPGA must be tested after being manufactured to determine whether the FPGA is operative or not. However, there are problems in testing an NVM-based (including a flash memory-based) FPGA. Since only a small percentage of the switching transistors are turned on in the FPGA for a user-configured circuit, the FPGA must be programmed several times into different test circuit configurations. Each test circuit configuration must be tested in order to achieve a good fault-coverage by using almost every switch in the configurable portion of the FPGA at least one time in one of these test circuit configurations. The total test time of a NVM-based FPGA is approximately the time required to erase and reprogram the FPGA a certain number of times until every switch is used once. Even in a flash memory-based FPGA in which a global erase is performed only once, it may take hours to test a part completely by using the standard programing method since one erase and programming cycle typically requires a few minutes. In comparison, the typical test time of other types of integrated circuits is a few seconds.

It should be evident that a test time of hours for one integrated circuit creates a serious problem. The manufacturer can either sell the NVM-based FPGA with either no or rudimentary testing and the hope that the integrated circuit is functional, or with full testing of the FPGA at a correspondingly high price. Neither alternative is acceptable.

On the other hand, the present invention is directed toward solving this testing problem and provides for the reduction of the total test time of an NVM-based FPGA and for the corresponding lowering of testing costs.

SUMMARY OF THE INVENTION

The present invention provides for a method of testing an FPGA having a plurality of programmable interconnects, or switches. Each programmable interconnect has an NVM memory cell interconnected with a switching transistor. Each NVM memory cell is arranged as part of a memory array of rows and columns. Each of the switching transistors is connected to the nodes of a plurality of logic elements and interconnections, which are organized into identical and/or differing tiles, the tiles organized into an array of rows and columns superimposed upon the memory array. The testing method has the steps of: selecting test circuit configurations by which identical tiles are identically programmed as much as possible; and simultaneously programming and simultaneously erasing pluralities of the memory rows corresponding to the tiles into the test circuit configurations. In this manner, the time for testing the FPGA is considerably reduced.

Additionally, the test circuit configurations programmed into the FPGA are tested at a lower supply voltage than that of normal operation. Programming of the memory cells (and hence the switching transistors) are performed at reduced programming and erasing pulse voltages and times by substantially ignoring retention and disturb effect margin amounts.

DETAILED DESCRIPTION OF SPECIFIC EMBODIMENTS

The present invention is described in terms of a flash memory-based FPGA, but is applicable to more general NVM-based FPGAs. A flash-based FPGA architecture may be considered as two arrays superimposed over each other. The first array is a two-dimensional, homogeneous array of reprogrammable memory cells described previously. The second array, which is used to implement the user-configured integrated circuit with defined functions, is a two-dimensional, heterogeneous array of logic elements and interconnections organized into blocks called "tiles." There are different types of tile with different hardwired circuits used within the FPGA architecture. Every tile type contains a number of programmable switches and is thus connected to a certain number of rows and columns of the memory cell array. The states of the memory cells associated with a tile set the states of the switching transistors in the tile to control the tile's function. A tile may contain only a logic function, only programmable interconnects which are part of the routing network of the FPGA, or both. U.S. Pat. No. 5,594,363, entitled "Logic Cell and Routing Architecture in a Field Programmable Gate Array," which issued Jan. 14, 1997 to the present assignee, describes exemplary tiles with logic elements and interconnections.

Each row of tiles consists usually only of tiles with the same number of memory rows. Each column of tiles consists usually of tiles with the same number of memory columns.

FIGS. 1–6 illustrate the components of a simplified flash-based FPGA architecture for purposes of explanation of the present invention.

Figure 1:
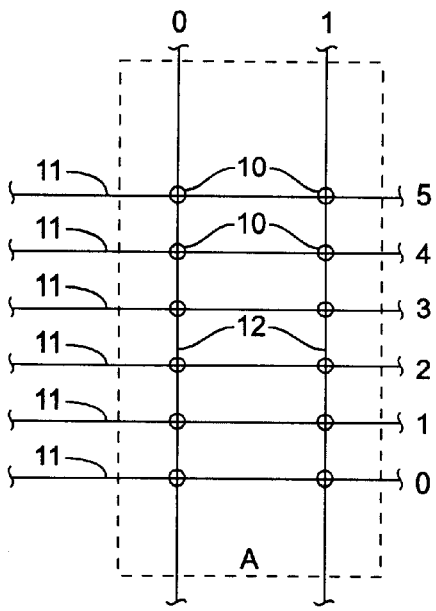
FIG. 1 illustrates the portion of a memory array corresponding to one type of tile in an exemplary flash memory-based FPGA, according to the present invention.

FIG. 1 shows the memory array portion of an exemplary tile type A as delineated by a dotted line in the drawing and labeled by the letter, A. The A tile type has 6 rows and 2 columns of memory cells. Each memory cell, drawn as a bubble 10, is located at the intersection of one of the row lines 11 and one of the column lines 12. The row lines 11 are numbered 0–5 and the column lines 12 are numbered 0–1.

Figure 2:
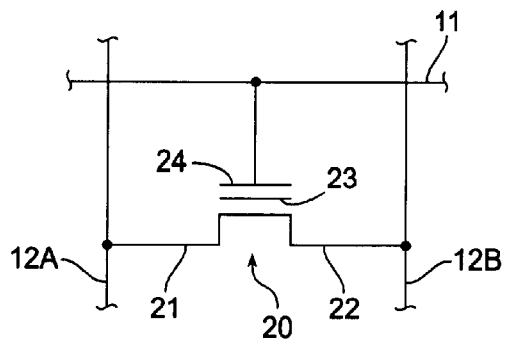
FIG. 2 illustrates the memory cell transistor in a programmable interconnect of the FPGA of FIG. 1.
Figure 3:
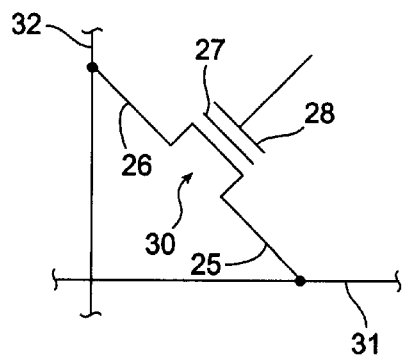
FIG. 3 shows the switching transistor of the programmable interconnect of the FPGA of FIG. 1.

The memory cell, which is formed by a single NVM transistor 20, is illustrated by FIG. 2. The memory transistor 20 has a source 21 and a drain 22 which are connected to a pair of column lines 12A and 12B respectively. Each pair of column lines 12A and 12B is simplified as one column line 12 in FIG. 1. The memory transistor 20 also has a floating gate 23 and a control gate 24. The control gate 24 is connected to a row line 11. The floating gate 23 stores information in the form of charge to determine whether the corresponding switching transistor 30, shown in FIG. 3, to which the memory transistor 20 is interconnected is turned on or off.

The switching transistor 30, which has a floating gate 27 connected to the floating gate 23 of the memory transistor 20 of FIG. 2, has a source 26 and drain 25, which are connected respectively to routing net lines 32 and 31. The switching transistor 30 also has a control gate 28 which is connected to the control gate 24 of the memory transistor 20.

Figure 4:
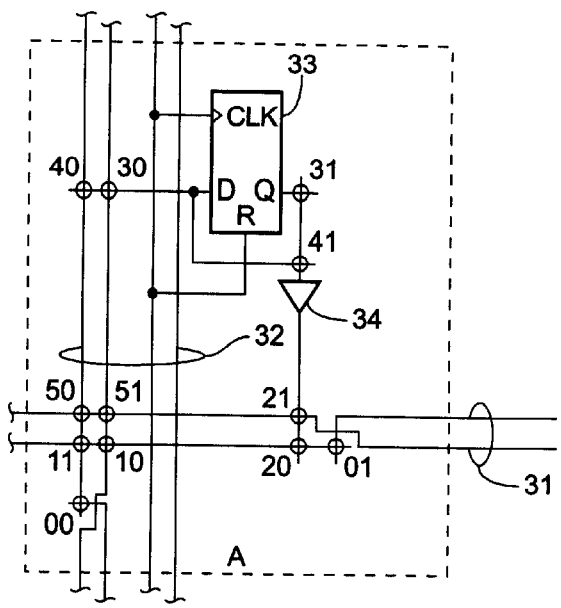
FIG. 4 is a diagram of the logic elements and interconnections of one type of tile corresponding to the memory array portion of FIG. 1.

The routing net lines 32 and 31 are part of the heterogeneous user-configurable array of logic elements and interconnections which are organized into tiles. FIG. 4 shows the elements of the A tile type, which has a D flip-flop 33 and a buffer 34 implemented in CMOS logic. Horizontal and vertical connections are provided by the routing net lines 31 and 32 respectively. As used in the drawings, a solid dot indicates a connection to a routing net line, such as the Reset terminal of the D flip-flop 33 to rightmost vertical net routing line 32. Each programmable interconnection, drawn as a bubble 35 at the intersection of two routing net lines 31 and 32 is one of the switching transistors 30. See FIG. 3 above. The two digits next to each bubble 35 specify the memory array location of the memory cell 20 which corresponds to that switching transistor 30. The first digit is the row number and the second digit is the column number of the memory cell 20 in the memory array portion of that tile. See FIG. 1.

Figure 5:
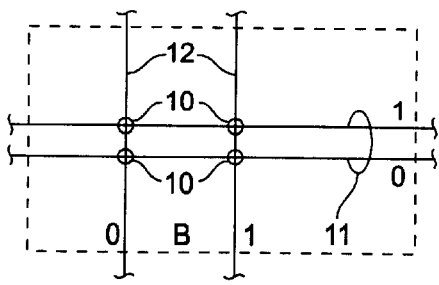
FIG. 5 illustrates the memory array portion of another type of tile in the flash memory-based FPGA.

FIG. 5 shows the memory array portion of a second exemplary tile type, again delineated by a dotted line and labeled with the letter, B. This B tile type has only two memory row lines 11, numbered 0–1, and two column lines 12, also numbered 0–1. The intersections of each of the row lines 11 and the column lines 12 have a bubble 10, indicative of an interconnected memory cell. Again refer to FIG. 2.

Figure 6:
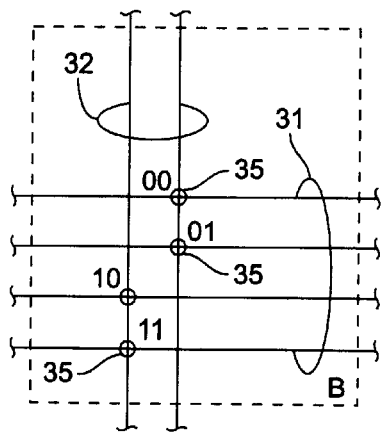
FIG. 6 is a diagram of the interconnections of the tile corresponding to the memory array portion of FIG. 5.

The logic elements and interconnections which are configured by the user for the FIG. 5 memory array portion are illustrated in FIG. 6. In this example, the B tile type consists only of four horizontal routing net lines 31 and two vertical routing net lines 32. There are four programmable interconnection, drawn as bubbles 35 at the different intersections of two sets of routing net lines 31 and 32. As for FIG. 4, the two digits next to each bubble 35 specify the memory array location of the memory cell 20 which corresponds to that switching transistor 30. The first digit is the row number and the second digit is the column number in the memory array portion illustrated by FIG. 5.

Figure 7:
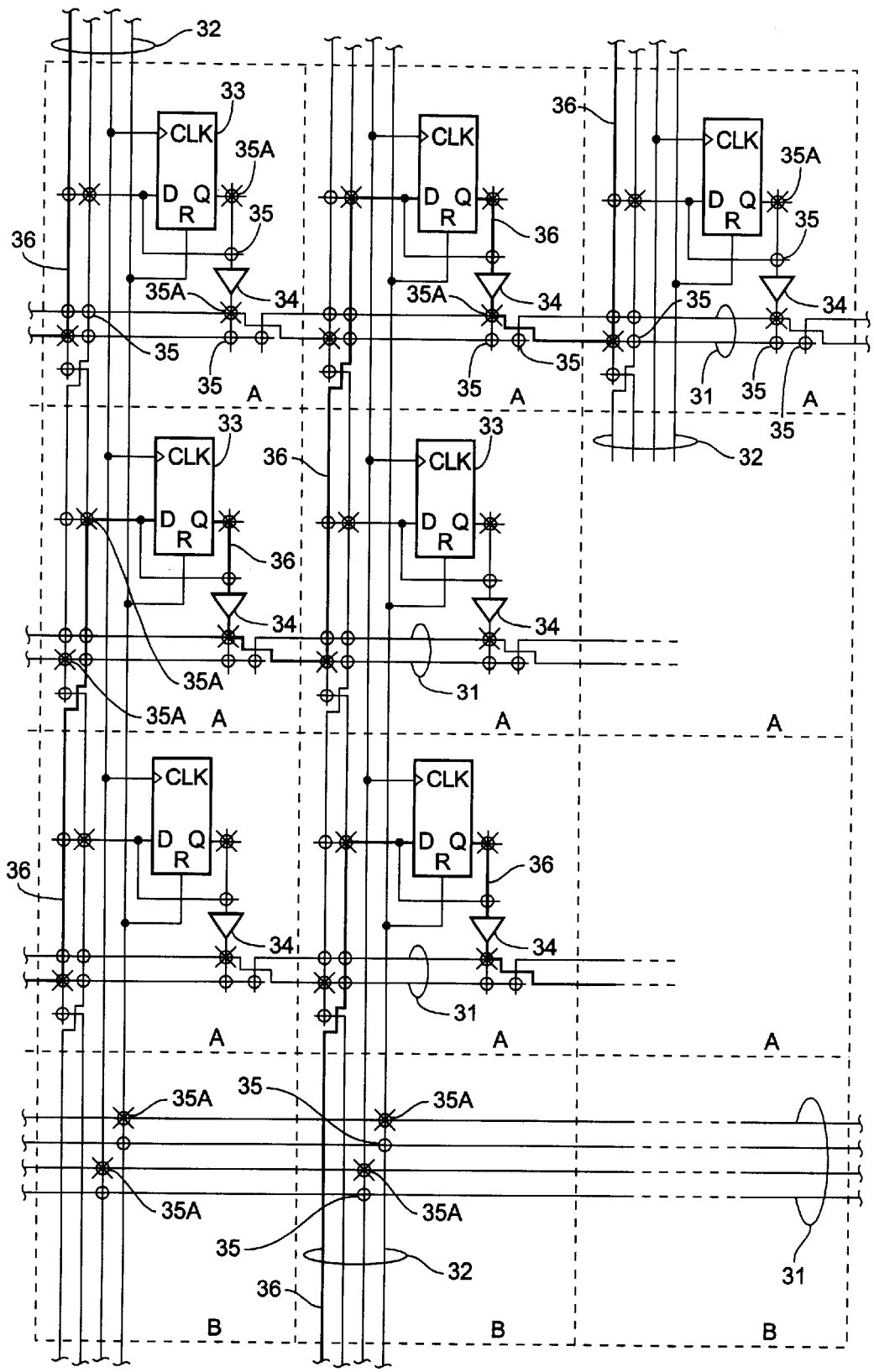
FIG. 7 is a diagram of the logic elements and interconnections of an array of FIG. 4 and FIG. 6 tiles, as programmed into a test circuit configuration according to the present invention.
Figure 8:
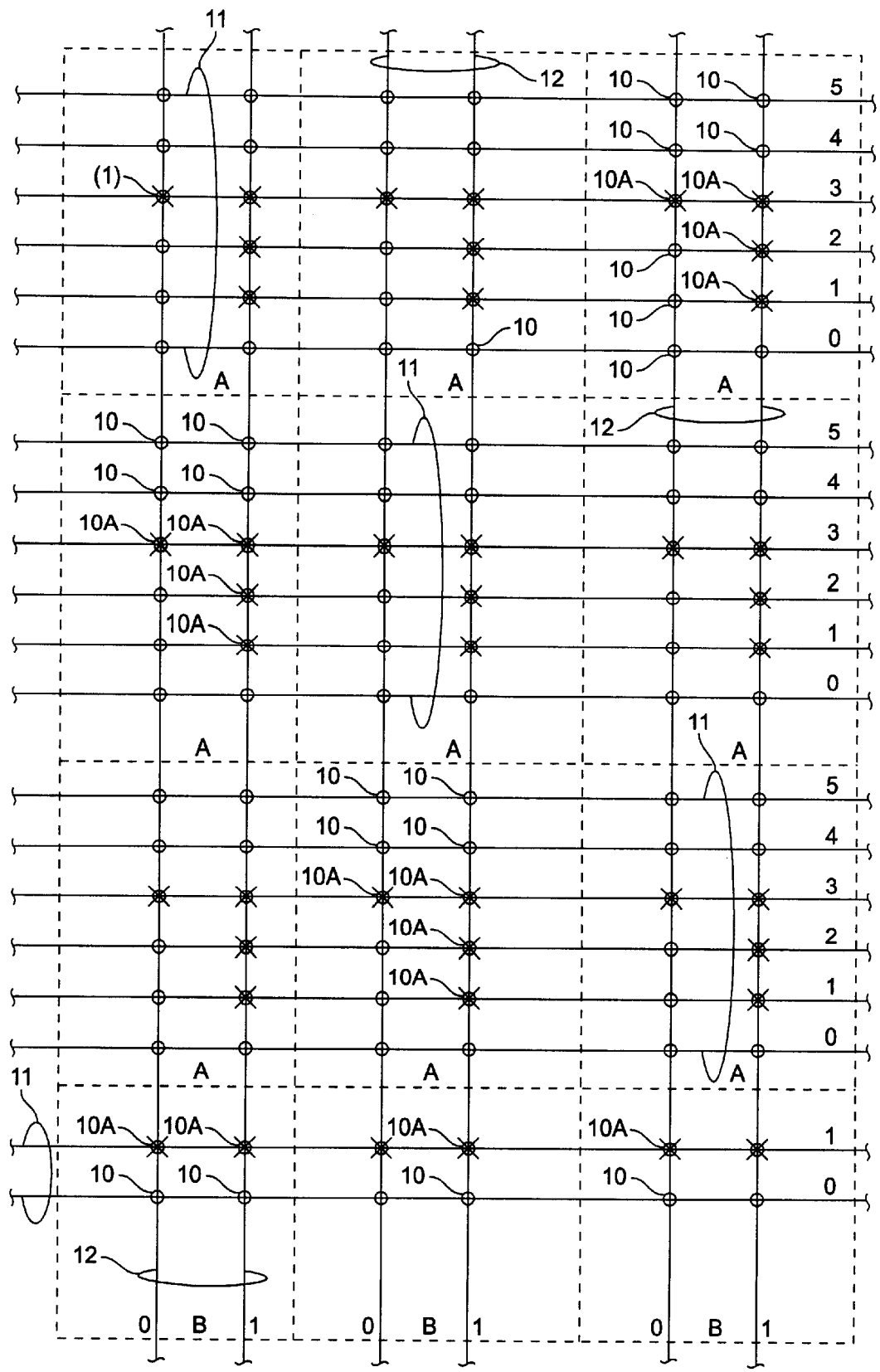
FIG. 8 illustrates the programmed memory array portion corresponding to the array of tiles in FIG. 7.

FIGS. 7 and 8 illustrate how an FPGA based on those components is programmed into an exemplary test circuit configuration, according to the present invention. FIG. 7 shows an array of logic elements and interconnections which consists of A and B types of tile. In this example, there is one row of B type tiles and three rows of A type tiles, arranged in three columns. The array of A and B tiles are programmed into a test circuit configuration. The programmable interconnections which are turned on, i.e., the connection is made, are indicated by crossed bubbles 35A. Uncrossed bubbles 35 indicate no connection. The resulting test paths is indicated by darkened portions 36 of certain net routing lines 31 and 32. The test circuit configuration uses the flip-flops 33 of all A tiles and connects them in diagonal shift-register paths, as marked by the portions 36. The two programmed switches in each B tile type select one of two clock nets and one of two Reset nets for the flip-flops 33 in the A tiles. Test signals can sent through the variously programmed logic elements, i.e., the D flip-flops 33 and buffers 34, and the interconnections which make up the test paths.

To configure the A and B tiles as illustrated by FIG. 7, the corresponding memory transistors 20 of the switching transistors 30 must be appropriately programmed. FIG. 8 shows the memory array portion which corresponds the configured A and B tiles of FIG. 7. In a manner similar to FIG. 7, the memory transistors 20 which are programmed to turn on their corresponding switching transistors 30 are indicated by crossed bubbles 10A.

In comparison to the test circuit configuration, a circuit configured by a user is most likely to be programmed differently at almost every tile position. Because of this, almost every row in a user-configured circuit must be programmed with a different pattern. Thus all rows must be programmed separately.

In accordance to the present invention, test circuit configurations are selected by which tiles of the same type are identically programmed as much as possible, as illustrated by the test circuit configuration in FIGS. 7 and 8. Each tile type A and each tile type B are programmed identically. Then, the FPGA is programmed (and erased) for testing with the following time-saving steps:

a) simultaneously programming several memory rows within a tile row;

b) skipping the programming of memory rows having no programmed memory cells;

c) simultaneously programming of rows of identical or nearly identical tiles;

d) simultaneously programming rows of completely different tiles; and e) incrementally erasing and reprogramming memory rows of a test circuit configuration to obtain a variation of the test circuit configuration. These steps are explained in detail below.

a) Simultaneously Programming Several Memory Rows Within a Tile Row

If the architecture of the FPGA is fine-grain, i.e., the logic elements in a tile are elementary, the number of different types of tile within each row of tiles is small and identical tile-types are programmed identically, there should be several identically programmed memory rows for each row of tiles. Since each memory row within a row of tiles is likely to be associated with a different function of the configured circuit, the identically programmed memory rows will be located irregularly within the tile row.

According to the present invention, these memory rows which are to be programed identically within a tile row are programmed simultaneously. For example, in all A type tiles in FIG. 8, memory rows 1 and 2 are programmed identically. Instead of two programming steps to program these two rows, just one programming step is necessary to program both rows. For this purpose, the row select logic for the memory array is capable of selecting any combination of memory rows within a tile row. Such select logic designs are well-known to integrated circuit designers.

b) Skipping Programming of Memory Rows Having No Programmed Memory Cells

Since the percentage of programmed interconnections in an FPGA is small, there should always be blank memory rows, i.e., where none of the programmable interconnects are programmed, in each tile. According to the present invention, the programming of all blank memory rows is simply skipped. For example, FIG. 8 shows that the three rows 0, 4 and 5 of the A tiles do not have any turned-on memory cells. Three programming steps can be skipped within an A tile row. Also, memory row 0 in the B tiles need not be programmed, since no memory cells are programmed in that row either.

With the present invention, the sequence of rows by which the FPGA is programmed is flexible to include the skipping of rows.

c) Simultaneously Programming of Rows of Identical or Nearly Identical Tiles

In most of the test circuit configurations, it has been observed that rows of identical and nearly identical tiles are programmed with the same pattern. With the present invention, all rows of tiles which are to be programmed identically are programmed simultaneously. Again returning to the example of FIG. 8, it should be noted that all A tile rows are programmed identically. Instead of programming all three tile rows sequentially, the rows of A tiles are be programmed simultaneously.

The row select logic of identical tile rows may be shared by all the tile rows. This saves the area occupied by the select logic in the integrated circuit.

d) Simultaneously Programming Rows of Completely Different Tiles

If the architecture of the FPGA has tile rows with completely different types of tile, the tiles are likely to be programmed differently. Nonetheless, if the selected test circuit configuration and the tile rows with differing tiles are sufficiently regular, there may be memory rows for one tile type which are to be programmed identically to other memory rows for different tile types. Of course, the corresponding switching transistors 30 in the user-configurable tiles are not necessarily located at the same positions, nor are the resulting configured functions or interconnections necessarily the same, in the differing tile types. Only the memory rows happen to be programmed identically. For example, FIG. 8 shows that memory row 1 for the B tile row is programmed identically to memory row 3 for the A tile row, though the functions of the switching transistors 30 associated with the memory rows of the two types of tile are different.

The present invention simultaneously programs these identically programmed memory rows for different tiles. Consequently, memory row 1 of the B tile row can be programmed simultaneously with memory row 3 of A tile row. Each row of completely different tiles have a separate row select logic for this programming step.

The result of the present invention is the reduction of the number of programming steps. In the example of FIG. 8, the present invention reduces the twenty programming steps in the conventional programming methodology to only two programming steps. The programming steps of both methods are listed in the table below:

The address is specified as "tile row"/"tile internal memory row," and the values are binary numbers.

| | Conventional | | Present Invention | |
|---|---|---|---|---|
| Step | Value | Address | Value | Addresses |
| step1 | 000000 | 0/0 | 111111 | 0/1, 1/3, 2/3, 3/3 |
| step2 | 111111 | 0/1 | 010101 | 1/1, 1/2, 2/1, 2/2, 3/1, 3/2 |
| step3 | 000000 | 1/0 | | |
| step4 | 010101 | 1/1 | | |
| step5 | 010101 | 1/2 | | |
| step6 | 111111 | 1/3 | | |
| step7 | 000000 | 1/4 | | |
| step8 | 000000 | 1/5 | | |
| step9 | 000000 | 2/0 | | |
| step10 | 010101 | 2/1 | | |
| step11 | 010101 | 2/2 | | |
| step12 | 111111 | 2/3 | | |
| step13 | 000000 | 2/4 | | |
| step14 | 000000 | 2/5 | | |
| step15 | 000000 | 2/0 | | |
| step16 | 010101 | 2/1 | | |
| step17 | 010101 | 2/2 | | |
| step18 | 111111 | 2/3 | | |
| step19 | 000000 | 2/4 | | |
| step20 | 000000 | 2/5 | | | e) Incrementally Erasing and Reprogramming Memory Rows of a Test Circuit Configuration to Obtain a Variation of the Test Circuit Configuration To further reduce testing time, only a few memory rows are erased and reprogrammed. In some tests it is useful to incrementally alter only a part of the test circuit configuration. By erasing and reprogramming only one or only some memory rows, a variation of the previous test circuit configuration may be obtained. A single erase and programming step may be sufficient to test one additional switch in each tile.

For example, the other two programmable interconnects in the B tiles in FIGS. 7 and 8 should tested by a different test circuit configuration. Instead of erasing the entire FPGA and programming again a completely new test circuit configuration (which can be performed in two programming steps as discussed above), memory row 0 of the B tiles need to be erased and the two switches in memory row 1 of the B tiles can be programmed in one programming step. The same test circuit configuration remains in the A tiles, but a different clock net and a different Reset net are selected for the flip-flops 33 in the A tiles.

Additional Time-Saving Techniques

Besides the techniques discussed above for reducing testing time, the present invention provides for additional time savings in testing the FPGA. Any integrated circuit, including NVM-based FPGAs, operates in a selected supply voltage range. A common voltage range for normal operation is 5 volts, i.e., between +5 volts and ground (0 volts). For the flash memory-based FPGA, the switching transistors 30 which are turned off require a negative voltage on the floating gate 27 (assuming, of course, that the transistors 30 are NMOS transistors). To ensure that the switching transistors 30 to be turned on, a more positive voltage than that of the supply voltage is required on the floating gate 27.

To ensure proper operation of each programmed interconnect of an FPGA over the expected lifetime of its programmed state, the final programming range specifies the minimum floating gate voltage of a turned-on switching transistor 30, as well as the minimum negative floating gate voltage of a turned-off switching transistor 30. Initially, the floating gates 27 of the switching transistors 30 must be programmed through their interconnected memory transistors 20 to a higher initial programming range in order to guarantee the final programming range after charge disturb and retention effects are considered. A retention effect margin is necessary to compensate for a floating gate voltage loss by leakage currents over the expected lifetime of a programmed state. For example, in a 5V technology, for example, the required floating gate voltage for turned-on switching transistors 30 might be 1.5V higher than the supply voltage of +5V in order to guarantee correct operations. The initial programmed voltage on the floating gate 27 might be +7V, if the sum of disturb and retention margins is 0.5V.

The disturb margin is necessary to compensate for a floating gate voltage loss by leakage currents during programming operations. Erased switching transistors 30 and their corresponding memory transistors 20, which are not supposed to be programmed and are unselected within a memory row, are subject to row disturb effects during the programming of the row. Programmed and erased switching transistors 30 are also subject to memory column disturb effects with every programming step of other memory rows. The amount of row disturb effects depends on the magnitude of the row programming pulse, i.e., the programming time and the programming voltage. The amount of column disturb effects depends on the number of programming steps, as well as the magnitude of the row programming pulses. The required length of the erase and programming pulses are strongly dependent upon the required initial programming range.

In accordance with the present invention, testing is performed at a reduced voltage supply. This reduces the final programming voltage range. The programming and erasing pulse voltages and times are reduced with the recognition that the retention and disturb margins may be essentially ignored. There is no need for the retention margin in testing, since a test circuit configuration is only required for a few seconds, as compared to a possible lifetime of years for a user-configured circuit. With the reduction in the number of programming steps for a test circuit configuration, as described above, the row and column disturb effects are significantly reduced. Furthermore, since the reduced supply voltages during testing operations reduce the required programming voltages, row, as well as column, disturb effects are reduced. Hence the margin to avoid the disturb effects may also be nearly eliminated.

For example, with 5V FPGA mentioned above, the device is still operative for testing at a 3V supply voltage. Utilizing aspects of the present invention described immediately above, the initial floating gate voltage need only be +4.5V, which avoids programming an additional +2.5V. Smaller and shorter programming pulses can easily achieve +4.5V on the floating gates 27 of the switching transistors 30. In this manner, the time to program and erase memory rows are reduced.

The advantages of the present invention have been demonstrated empirically. For the same flash memory-based FPGA, conventional testing which took three hours has been reduced to 10 seconds by using all of the techniques in accordance with the present invention.

While the description above provides a full and complete disclosure of the preferred embodiments of the present invention, various modifications, alternate constructions, and equivalents will be obvious to those with skill in the art. Thus, the scope of the present invention is limited solely by the metes and bounds of the appended claims.

What is claimed is:

1. In an FPGA having a plurality of programmable interconnects, each programmable interconnect having an NVM memory cell interconnected with a switching transistor, each NVM memory cell arranged as part of a memory array of rows and columns, each of said switching transistors is connected to nodes of a plurality of logic elements and interconnections, said logic elements and interconnections organized into identical and/or differing tiles, said tiles organized into an array of rows and columns, a method of testing said FPGA comprising:

selecting test circuit configurations by which tiles are identically programmed as much as possible; and simultaneously programming and simultaneously erasing pluralities of said memory rows corresponding to said tiles into said test circuit configurations;

whereby time for testing said FPGA is reduced.

2. The method of testing an NVM cell-based FPGA of claim 1 wherein said simultaneously programming and simultaneously erasing step comprises:

simultaneously programming a plurality of said memory rows within a row of tiles.

3. The method of testing an NVM cell-based FPGA of claim 1 further comprising:

skipping programming of memory rows having no memory cells to be programmed.

4. The method of testing an NVM cell-based FPGA of claim 2 further comprising:

skipping programming of memory rows having no memory cells to be programmed.

5. The method of testing an NVM cell-based FPGA of claim 1 wherein said simultaneously programming and simultaneously erasing step comprises:

simultaneously programming memory rows corresponding to rows of identical or nearly identical tiles.

6. The method of testing an NVM cell-based FPGA of claim 1 wherein said simultaneously programming and simultaneously erasing step comprises:

simultaneously programming memory rows corresponding to rows of different tiles.

7. The method of testing an NVM cell-based FPGA of claim 1 comprising:

incrementally erasing and reprogramming memory rows of a test circuit configuration to obtain a variation of said test circuit configuration.

8. The method of testing an NVM cell-based FPGA of claim 1 comprising:

testing said test circuit configurations at a lower supply voltage than that of normal operation.

9. The method of testing an NVM cell-based FPGA of claim 8 comprising:

reducing programming and erasing pulse voltages and times by a retention margin amount.

10. The method of testing an NVM cell-based FPGA of claim 1 comprising:

reducing programming and erasing pulse voltages and times by a retention margin amount.

11. The method of testing an NVM cell-based FPGA of claim 1 comprising:

reducing programming and erasing pulse voltages and times by a disturb effect margin amount.

* * * * *